United States Patent
Yelehanka et al.

(10) Patent No.: US 8,236,678 B2
(45) Date of Patent: Aug. 7, 2012

(54) TUNABLE SPACERS FOR IMPROVED GAPFILL

(75) Inventors: Ramachandramurthy Pradeep Yelehanka, Singapore (SG); Shailendra Mishra, Singapore (SG); Sripad Nagarad, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 18 days.

(21) Appl. No.: 12/336,544

(22) Filed: Dec. 17, 2008

(65) Prior Publication Data

US 2010/0148269 A1   Jun. 17, 2010

(51) Int. Cl.
*H01L 21/3205* (2006.01)
*H01L 21/4763* (2006.01)

(52) U.S. Cl. ............ 438/585; 257/368; 257/E21.438; 257/E29.255

(58) Field of Classification Search ............... 438/585; 257/368, E21.438, E29.255
See application file for complete search history.

(56) References Cited

U.S. PATENT DOCUMENTS

| | | | | |
|---|---|---|---|---|
| 5,935,873 A * | 8/1999 | Spuler et al. | ............ | 438/710 |
| 6,255,180 B1 * | 7/2001 | Smith | ............ | 438/301 |
| 6,632,745 B1 * | 10/2003 | Yap et al. | ............ | 438/696 |
| 2005/0215019 A1 * | 9/2005 | Wang et al. | ............ | 438/303 |
| 2005/0242376 A1 * | 11/2005 | Chen et al. | ............ | 257/214 |

OTHER PUBLICATIONS

Wet etching, Applied Physics 298r, E.Chen Apr. 12, 2004.*

* cited by examiner

*Primary Examiner* — Matthew Landau
*Assistant Examiner* — Sonya McCall Shepard
(74) *Attorney, Agent, or Firm* — Horizon IP Pte Ltd (57) ABSTRACT

A device that includes a substrate with an active region is disclosed. The device includes a gate disposed in the active region and tunable sidewall spacers on sidewalls of the gate. A profile of the tunable sidewall spacers includes upper and lower portions in which width of the spacers in the upper portion is reduced at a greater rate than the lower portion.

23 Claims, 9 Drawing Sheets

TUNABLE SPACERS FOR IMPROVED GAPFILL

BACKGROUND

Integrated circuits (ICs) typically comprise numerous circuit components interconnected to perform the desired functions. Such circuit components include, for example, transistors such as field effect transistors (FETs). Interconnections are formed by forming contacts and conductive lines in a dielectric layer using, for example, damascene techniques. A damascene structure, for example, includes a via or contact hole in a lower portion and a trench which is generally wider than the contact hole in an upper portion. The via serves as a contact to a device while the trench contains the conductive line for connecting the device to, for example, other devices.

As critical dimensions (CD) continue to shrink, gaps between gates of transistors decreases. Various problems occur with decreasing gap sizes. For example, reliable gap fill can become a challenge as well as shorting between contacts.

SUMMARY

Embodiments generally relates to semiconductor devices. In one embodiment, a method for forming a device is presented. The method includes providing a substrate with an active region. The substrate is prepared with a gate. Sidewall spacers are formed on the sidewall of the gate. The method further includes performing a tuning process on the spacers to produce a profile wherein width of the spacers in an upper portion is reduced at a greater rate than a lower portion.

In another embodiment, a method for forming a tunable sidewalls spacers is disclosed. The method includes providing a substrate having a feature thereon. A dielectric layer is formed on the substrate covering the feature and the dielectric layer is patterned to form tunable sidewall spacers. A width of the spacers in an upper portion is reduced at a greater rate than a lower portion in a tuning process.

A device that includes a substrate with an active region is disclosed in another embodiment. The device includes a gate disposed in the active region. Tunable sidewall spacers are disposed on sidewalls of the gate, wherein a profile of the tunable sidewall spacers includes upper and lower portions in which width of the spacers in the upper portion is reduced at a greater rate than the lower portion.

These and other objects, along with advantages and feature of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Embodiments generally relates to semiconductor devices or ICs. The ICs, for example, can be various types of ICs, such as memory devices including dynamic random access memories (DRAMs), static random access memories (SRAMs), non-volatile memories including programmable read-only memories (PROMs) and flash memories, optoelectronic devices, logic devices, communication devices, digital signal processors (DSPs), microcontrollers, system-on-chip, as well as other types of devices, such as micro-electromechanical systems (MEMs). The ICs can be incorporated in various types of products. Such products may include cell phones, personal digital assistants, computers or other electronic products.

Figure 1:
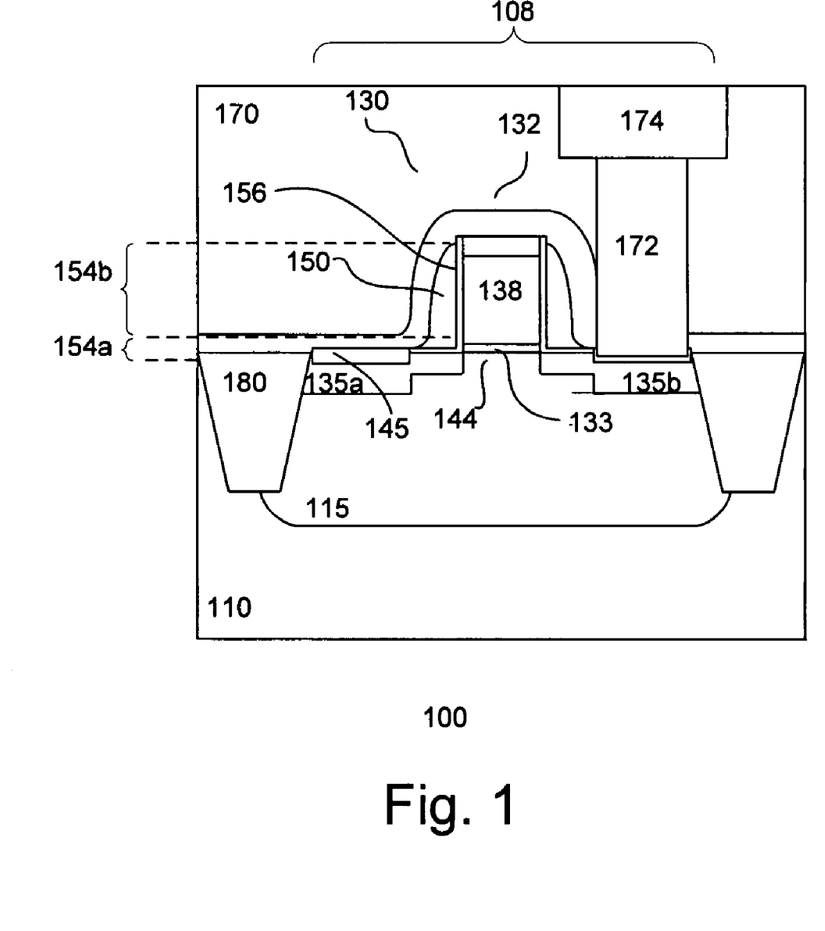
FIG. 1 shows a cross-section of a portion of an embodiment of an IC.

FIG. 1 shows a cross-sectional view of an embodiment of a portion of an IC 100. The IC includes a substrate 110. The substrate comprises a semiconductor material, such as silicon. Other types of semiconductor substrates are also useful. For example, the substrate can be a silicon on insulator (SOI) substrate. Defined on the substrate is an active region 108. The active region includes a doped well 115 of a first charge carrier type. The first charge carrier type may be p-type charge carriers. For example, the doped well comprises p-type dopants such as boron (B), aluminum (Al) or a combination thereof. Alternatively, the first charge carrier type may be n-type charge carriers, such as phosphorous (P), arsenic (As), antimony (Sb) or a combination thereof.

Isolation regions 180 are provided to isolate the active region from other device regions. The isolation regions, for example, are shallow trench isolations (STIs). STIs comprise trenches formed in the substrate and filled with a dielectric material. The isolation regions are used to isolate active device regions on the substrate. The depth of the STIs is generally about 1500-4500 Å. Other depths are also useful. The doped well typically overlaps the bottom of the STIs.

A transistor 130 is disposed in the active region. The transistor, for example, is a field effect transistor (FET). The transistor may also be other types of transistors. The transistor comprises a second type transistor. In one embodiment, the second type transistor comprises a n-type transistor. Alternatively, the second type transistor can be a p-type transistor. The transistor includes a gate stack 132. The gate stack can be gate conductor which forms a plurality of transistors having a common gate.

In one embodiment, the gate stack includes a gate electrode 138 over a gate dielectric 133. In other embodiments, the gate stack can be provided with other types of gate stack layers. The gate electrode, for example, may be polysilicon while the gate dielectric may be silicon oxide. Providing a gate stack with other types of gate electrode and gate dielectric materials are also useful.

Offset spacers 156 may be provided on sidewalls of the gate stack. The offset spacers are employed, for example, in applications with offset lightly doped diffusion (LDD) extensions. The offset spacers facilitate creating an offset to locate the LDD extensions away from the gate or poly corner. Dielectric materials, such as silicon nitride, silicon oxide or a combination thereof, can be used to form the offset spacers. Other types of dielectric materials can also be used for the offset spacers.

Sidewall spacers 150 are disposed on the sidewalls of the gate stack. As shown, the sidewall spacers are disposed on the offset spacers. The sidewall spacers are formed from a dielectric material. In one embodiment, the dielectric material, for example, can be silicon nitride. In one embodiment, the sidewall spacers comprise doped silicon nitride. In one embodiment, the spacer comprises doped hexachlorosilane (HCD) silicon nitride. Other types of dielectric materials are also useful. In one embodiment, the material of the offset spacers is selected to have etch selectivity with the sidewall spacers.

Beneath the gate stack is a channel region 144 of the transistor. First and second diffusion regions 135a-b are provided adjacent to the gate stack, separated by the channel region. The diffusion regions include second type charge carriers. This produces a second type transistor on the first type doped well. The second type charge carriers, for example, may be n-type dopants, such as P, As, Sb or a combination thereof, to form a n-type transistor. Alternatively, a p-type transistor can be formed on the n-type well. The dopant concentration of the diffusion regions is about E13-E15, with a depth of about 100-400 Å.

In one embodiment, LDD extensions are provided for the diffusion regions. The extensions are disposed, for example, under the spacers. Metal silicide contacts 145 can be provided on the top of the gate and diffusion regions to reduce sheet resistance. The silicide contacts, for example, are nickel or nickel alloy silicide contacts. Other types of metal silicide contacts, such as Co and Ti or alloys thereof, can also be used.

In alternative embodiments, offset spacers can be eliminated. For example, offset spacers may not be needed for applications which do not employ offset LDD extensions. Other configurations of spacers and diffusion regions are also useful.

In one embodiment, the sidewall spacers comprise tunable sidewall spacers. As shown, the tunable sidewall spacers comprise a foot at the lower portion 154a, producing a sidewall profile which is steeper at the upper portion 154b than at the lower portion. This produces an average slope at the upper portion of the spacer which is steeper than the slope at the foot or lower portion.

The tunable sidewall spacers have an initial profile with an upper width $W_{IU}$ in the upper portion and an initial lower width $W_{IL}$ in the lower portion 154a. The lower width forms, for example, the footprint of the sidewall spacers. The footprint, for example, determines the width of the extension regions of the diffusion regions. The width of the lower portion of the spacers, for example, is about 100-400 Å. Other widths are also useful. With the tunable sidewall spacers, the width at the upper portion can be reduced by a greater amount than the lower portion. For example, the final width in the upper portion $W_{FU}$ can be thinner than the final width in the lower portion $W_{FL}$. The profile of the spacers can be tuned by a tuning process, such as an isotropic etch. The isotropic etch, for example, can be a wet etch.

In one embodiment, the tunable sidewall spacers comprise a profile with an initial width ratio $W_{IU}/W_{IL}$ or $W_{IR}$ which is greater than the final width ratio $W_{FU}/W_{FL}$ or $W_{FR}$. In one embodiment, $W_{IR}$ is greater than $W_{FR}$ by at least about 0.1-0.9. Other values by which $W_{IR}$ is greater than $W_{FR}$ may also be useful. The reduction in width of the spacer can be gradual, for example, decreasing less and less from the top to the bottom of the gate stack.

The profile of the tunable sidewall spacers, in one embodiment, is produced by providing the spacer layer with different etch or removal rates in upper and lower parts of the layer by the tuning process, such as wet etching. In one embodiment, the etch rate profile of the spacer layer has a higher etch rate at an upper part of the layer than the lower part. In one embodiment, the spacer layer has a graduated etch rate, decreasing from the upper to the lower part of the layer.

The etch rate profile, for example, can be controlled by doping the spacer layer with an etch rate controlling (ERC) dopant. In one embodiment, the ERC dopants decrease the etch rate of the spacer layer. For example, the ERC dopants densify the spacer layer to decrease its etch rate. In one embodiment, the ERC dopant includes carbon. Other types of ERC dopants are also useful. Doping the spacer layer with a combination of different ERC dopants are also useful. The dopants, for example, can be incorporated into the spacer by an in-situ process. Alternatively, other processes, such as implantation, can be employed to incorporate the dopants into the spacers.

The spacer, in one embodiment, comprises a graded dopant profile to produce a higher etch rate at the top of the spacer than at the bottom. For example, the spacer comprises a graded dopant profile which is higher at the bottom of the spacer than at the top to produce the desired sidewall profile. The graded dopant profile can be gradual or stepped.

In alternative embodiments, the ERC dopants increase the etch rate of the spacer material. For such application, the graded dopant profile is higher at the top of the spacer than at the bottom to produce the desired sidewall profile.

A dielectric layer 170 is disposed over the substrate. The dielectric layer, for example, serves as an interconnect dielectric (ICD) layer in which interconnects are formed. For example, the dielectric separates the substrate and transistor from the first metal level (M1). The dielectric layer can, for example, be silicon oxide. Other types of dielectric materials are also useful. For example, the dielectric layer can include doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide, and low-k or ultra low-k dielectric materials such as organo-silicate glass (OSG) and porous low-k materials. Preferably, at least the IMD layer comprises a low-k or ultra low-k dielectric material.

In one embodiment, the ICD includes lower and upper portions. The lower portion serves as an interlevel dielectric (ILD) layer while the upper portion serves as an intrametal dielectric (IMD) layer. The dielectric layer can be a single layer or multi-layered stack. For example, a single layer can be used to serve as both the ILD and IMD or separate layers are used for the ILD and IMD. In some cases, an etch stop layer can be disposed between the ILD and IMD.

An interconnect is formed in the ICD layer. In one embodiment, the interconnect includes a conductive line 174 in the upper portion or IMD while a contact 172 is disposed in the lower portion or ILD. The interconnect can be formed from a conductive material, such as a metal or alloy. In one embodiment, the interconnect can be copper, aluminum, tungsten, their alloys, or a combination thereof. It is understood that the contacts and conductive line can be the same or different materials. The contact connects the conductive line to contact regions below. As shown, the contact connects the conductive line to a diffusion region or gate of a transistor. Depending on the ICD level, the contact region can be other type of contact regions, such as another metal line. The IC can include numerous interconnects.

By providing tunable spacers, the footprint of the spacers can be maintained to achieve the desired extension widths while increasing the gap between, for example, transistors to improve gapfill. As such, tunable spacers improve performance and reliability of devices. Furthermore, the improvements can easily be integrated in current process flows since no additional masks are required.

Figure 2A:
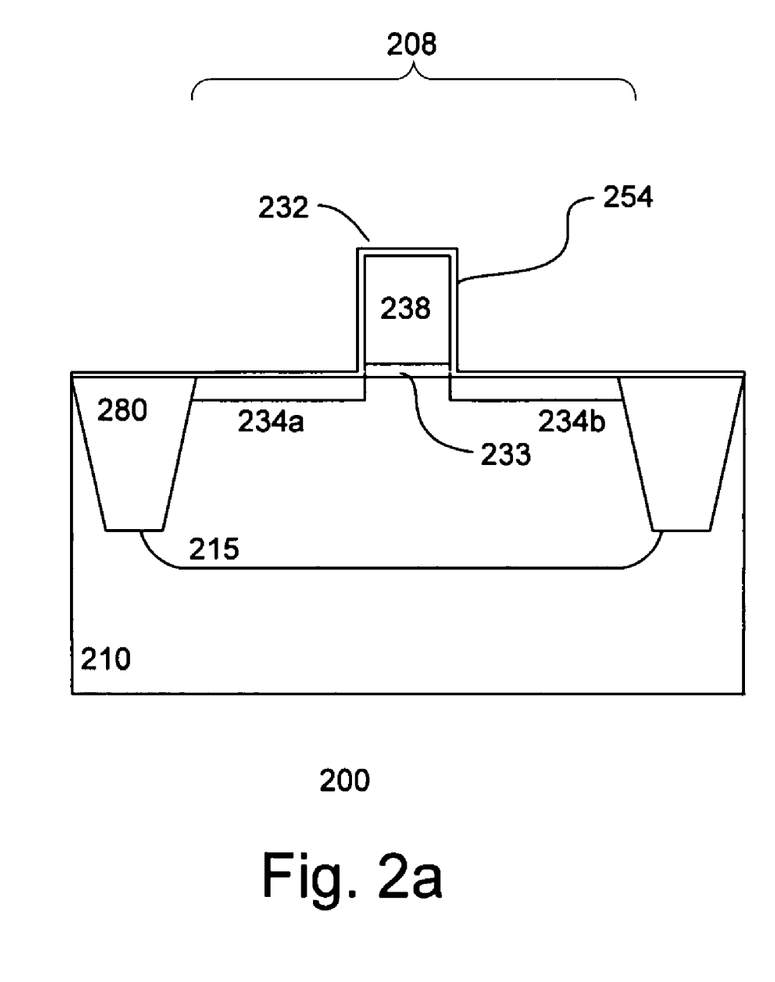
FIGS. 2a-g shows an embodiment of a process for forming an IC.

FIGS. 2a-g show an embodiment of a process for forming an IC 200. Referring to FIG. 2a, a substrate 210 is provided. The substrate, in one embodiment, comprises a p-type silicon substrate. Other types of substrates, such as a germanium-based, gallium arsenide, silicon-on-insulator (SOI), or sapphire substrate, are also useful.

The substrate is prepared with an active region 208 isolated by isolation regions 280. The isolation regions, for example, comprise STIs. STIs include trenches formed in the substrate using patterning techniques, such as lithography and etching. The formed trenches are filled with a dielectric material. The dielectric material can include silicon oxide or silicon nitride. Other types of dielectric materials can also be used to fill the trenches. Various techniques, such as chemical vapor deposition (CVD), can be used to form the dielectric material to fill the trenches. Other types of processes can also be used. Excess dielectric material is removed, for example, by planarizing techniques to form the STIs. Various planarizing techniques can be employed, such as chemical mechanical polishing (CMP). Other types of planarizing techniques are also useful.

A doped well 215 is formed. The doped well includes first type dopants. In one embodiment, the first type dopants are p-type dopants which forms a p-type doped well. The p-type dopants can include, for example, B. The dopant concentration of the doped well, for example, is about $1E10$-$1E14/cm^2$. Other concentrations are also useful. Ion implantation techniques, such as implantation with a mask, can be used to form the doped well. Other techniques are also useful. In other embodiments, the doped well may be formed prior to forming the STIs.

The active region is prepared with a gate stack 232. In one embodiment, the gate stack comprises a gate electrode 238 over a gate dielectric layer 233. Providing gate stacks with other types of layers is also useful. The gate dielectric, for example, comprises silicon oxide while the gate electrode comprises polysilicon. Forming a gate stack with other types of gate dielectric and gate electrode materials is also useful. To form the gate stack, various gate stack layers are formed on the substrate and patterned using mask and etch techniques. The gate stack can be a gate conductor which is a common gate for a plurality of transistors. The gate layers can be formed using various techniques. Such techniques, for example, can include thermal oxidation and/or chemical vapor deposition (CVD). Other techniques are also useful.

In one embodiment, LDD regions 234a-b are formed in the active region of the substrate adjacent to the gate stack. In one embodiment, LDD regions comprise dopants of second carrier type. For example, the LDD regions comprise n-type dopants, such as P, As, Sb or a combination thereof, to form n-type diffusion regions. Alternatively, the LDD regions comprise p-type dopants to form p-type diffusion regions. The LDD regions, for example, serve as source/drain extension regions. The dopant concentration of the LDD regions may be about $E13$-$E15$. Providing other dopant concentrations for the LDD regions is also useful. To form the LDD regions, ion implantation techniques can be used.

To offset the LDD regions, an offset spacer is first formed. To form the offset spacer, a dielectric layer 254 is formed over the substrate, covering the gate stack and diffusion regions. The dielectric layer, for example, comprises silicon oxide, silicon nitride or a combination thereof. Other types of dielectric materials are also useful. Various techniques, such as CVD, can be employed to form the dielectric layer. The dielectric layer is patterned by, for example, RIE, to remove horizontal portions thereof, leaving it remaining on the sidewalls. The LDD regions are formed after forming the offset spacers.

In alternative embodiments, offset spacers are not needed. For such embodiments, the LDD regions are formed after patterning the gate stack.

In one embodiment, an etch stop layer (not shown) is formed on the substrate. In one embodiment, the etch stop layer serves as an etch stop below the subsequently formed spacers. The etch stop layer, in one embodiment, comprises silicon oxide. The etch stop layer can be formed by, for example, thermal oxide. Other processes for forming the etch stop layer, such as PECVD, LPCVD, ALD or RTCVD, are also useful.

Figure 2B:
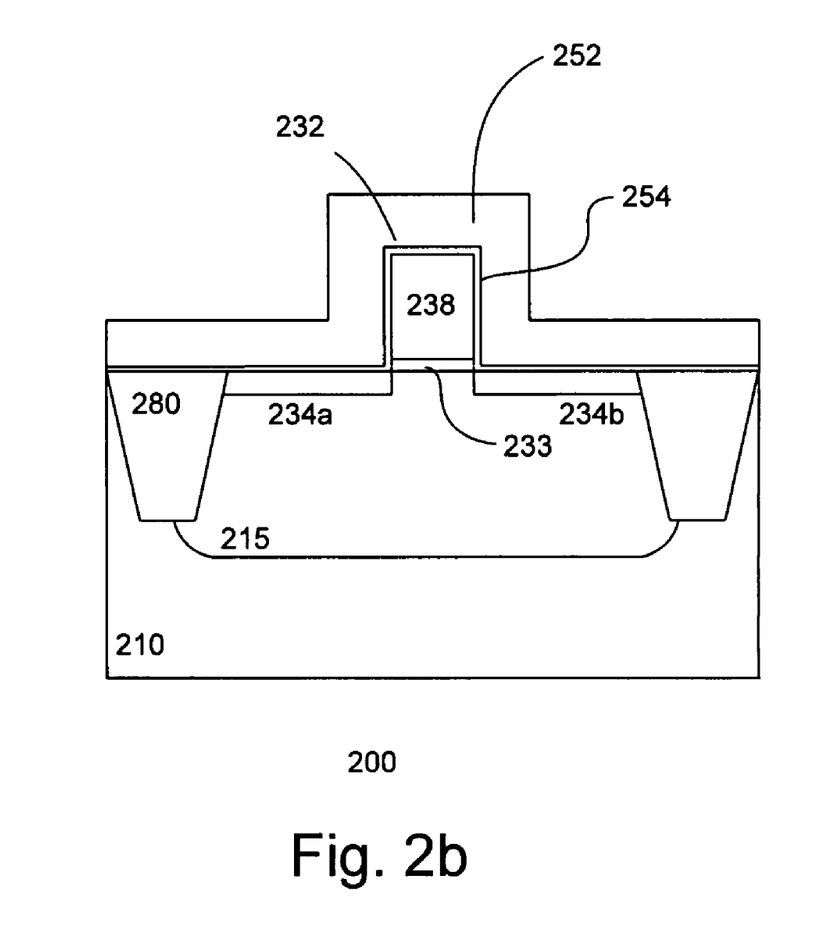

As shown in FIG. 2b, a spacer layer 252 is formed over the offset dielectric layer. The spacer layer, for example, comprises silicon nitride. Other types of dielectric materials are also useful. In one embodiment, the spacer layer comprises HCD silicon nitride. For example, the HCD layer can be formed at a temperature of about 500-600° C., pressure of about 0.2-0.3 Torr, HCD flow of about 20-80 sccm and $NH_3$ flow of about 1.5-2 SLM. The thickness of the spacer layer may be, for example, about 100-400 Å. Other process parameters and thicknesses are also useful.

In one embodiment, the spacer layer comprises an etch rate gradient from a tunable process, such as an isotropic or wet etch. The etch rate gradient is higher at the upper portion of the spacer layer than at the bottom. For example, the etch rate at the top is about 50% greater than at the lower portion. Other etch rate differentials are also useful. The etch rate gradient can be gradual or in steps. In other embodiments, the layer can have different etch rate gradients. The etch rate gradient is selected to achieve the desired spacer profile.

In one embodiment, the gate sidewall spacer layer comprises ERC dopants. In one embodiment, the ERC dopants comprise carbon. Other types of ERC dopants are useful. Doping the spacer layer with a combination of different ERC dopants are also useful. In one embodiment, the ERC dopants decrease the etch rate of the spacer layer. For example, the ERC dopants densify the spacer layer to decrease its etch rate.

The dopants, for example, can be incorporated in to the spacer layer by an in-situ process. For example, during formation of the spacer layer, dopant source can be provided. For example, carbon dopant source, such as $C_2H_4$ or $CH_4$ can be provided. Other types of dopant or carbon dopant sources are also useful. The flow rate of $C_2H_4$ may be about 0.5-1 SLM while $CH_4$ can be about 1-2 SLM. Other flow rates are also useful. In other embodiments, the dopants may be incorporated by other processes, such as implantation.

In alternative embodiments, the ERC dopants increases the etch rate of the spacer layer.

Figure 2C:
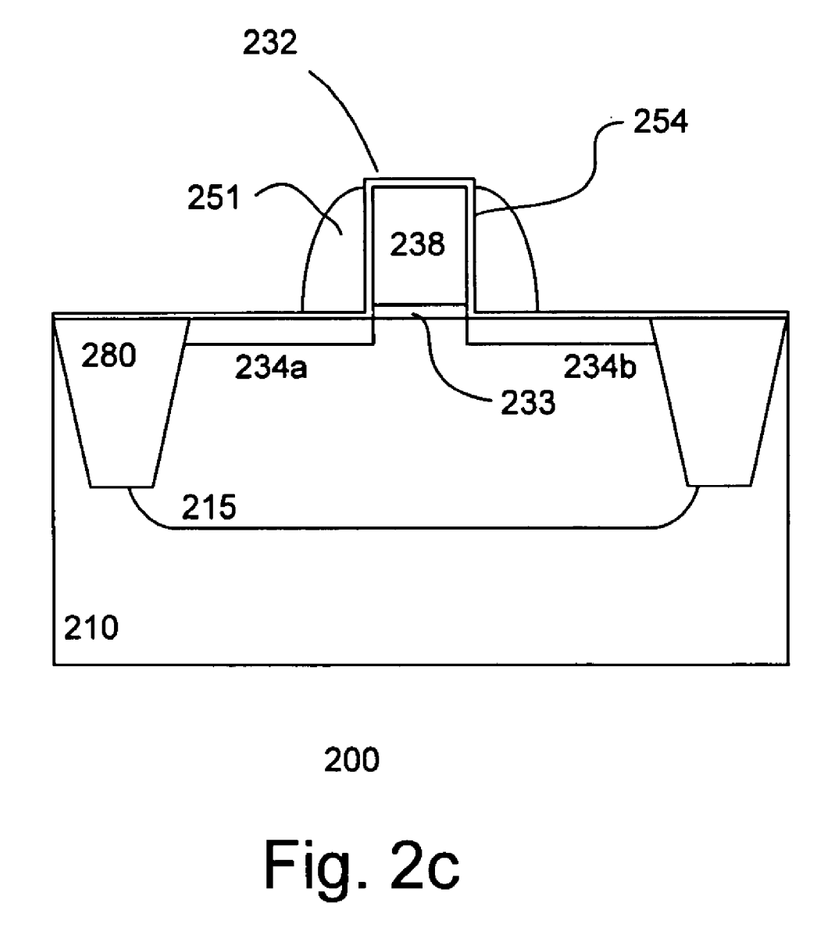

Referring to FIG. 2c, the spacer layer is patterned to form preliminary sidewall spacers 251. The spacer layer is patterned by an anisotropic etch, such as a reactive ion etch (RIE). The etch removes horizontal portions of the layers, leaving preliminary sidewall spacers. In one embodiment, the etch is selective to the offset dielectric layer. This leaves the offset dielectric layer covering the gate stack and substrate.

Figure 2D:
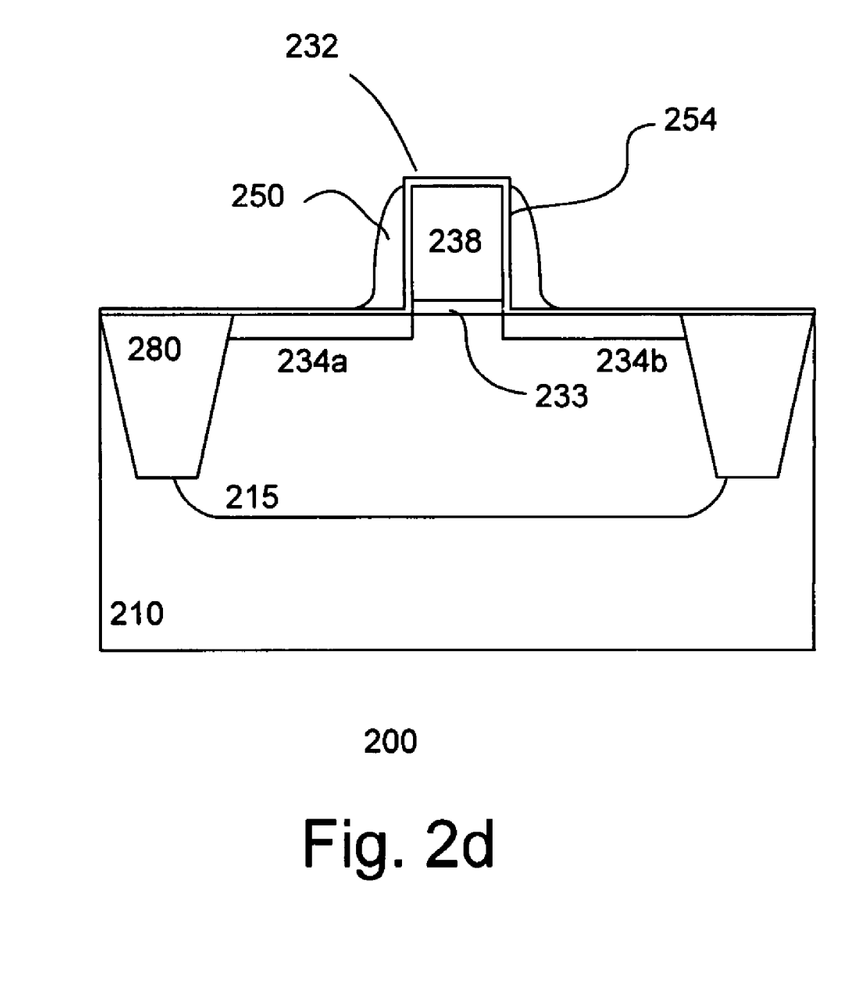

In FIG. 2d, a spacer tuning process is performed. In one embodiment, the tuning process forms spacers 250 with the desired profile. The tuning process, for example, comprises an isotropic etch, such as a wet etch. The tuning process can be performed at room temperature. In one embodiment, the tuning process comprises a wet etch in DHF chemistry. The DHF can be about 300:1 DI water to HF solution. Other types of etch chemistry may also be useful.

Figure 2E:
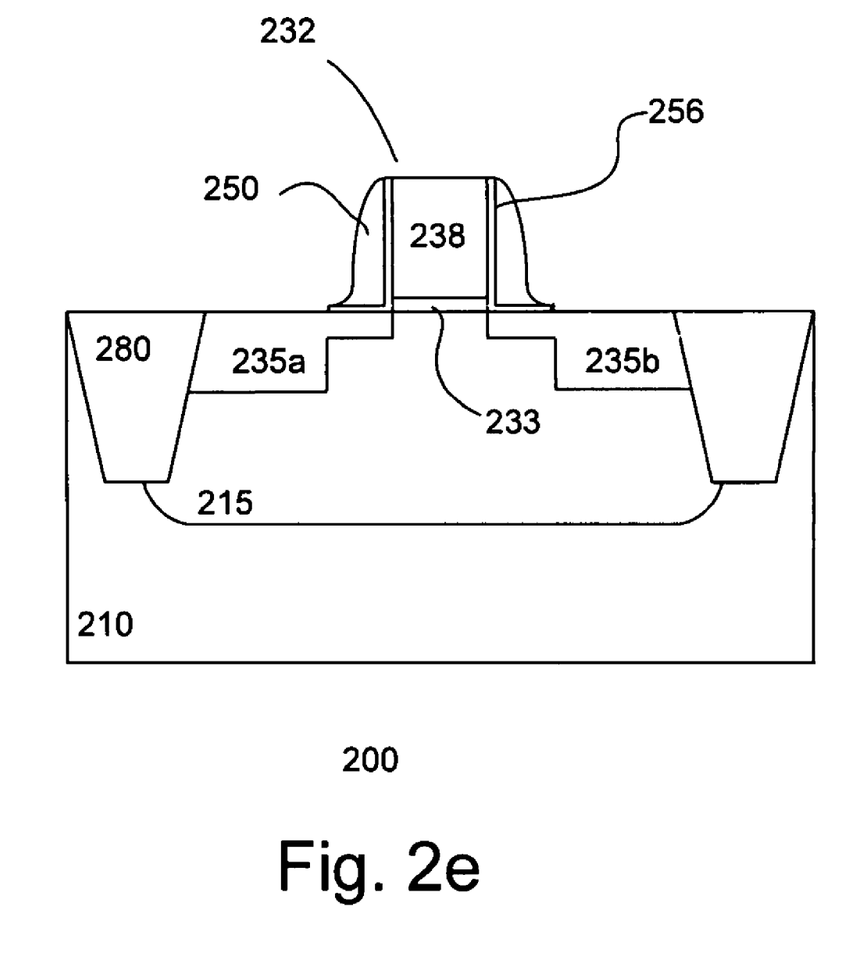

As shown in FIG. 2e, the etch stop layer is patterned to expose the active region adjacent the tunable spacers and STIs. For example, the etch stop layer is patterned by an etch, such as anisotropic dry etch. Diffusion regions 235a-b are formed in the exposed active region. The diffusion regions comprise second type dopants. In one embodiment, the diffusion regions comprise a dopant concentration of about E13-E15 and have a depth of about 100-400 Å. Other dopant concentrations and depths are also useful. Ion implantation techniques can be employed to form the diffusion regions.

Figure 2F:
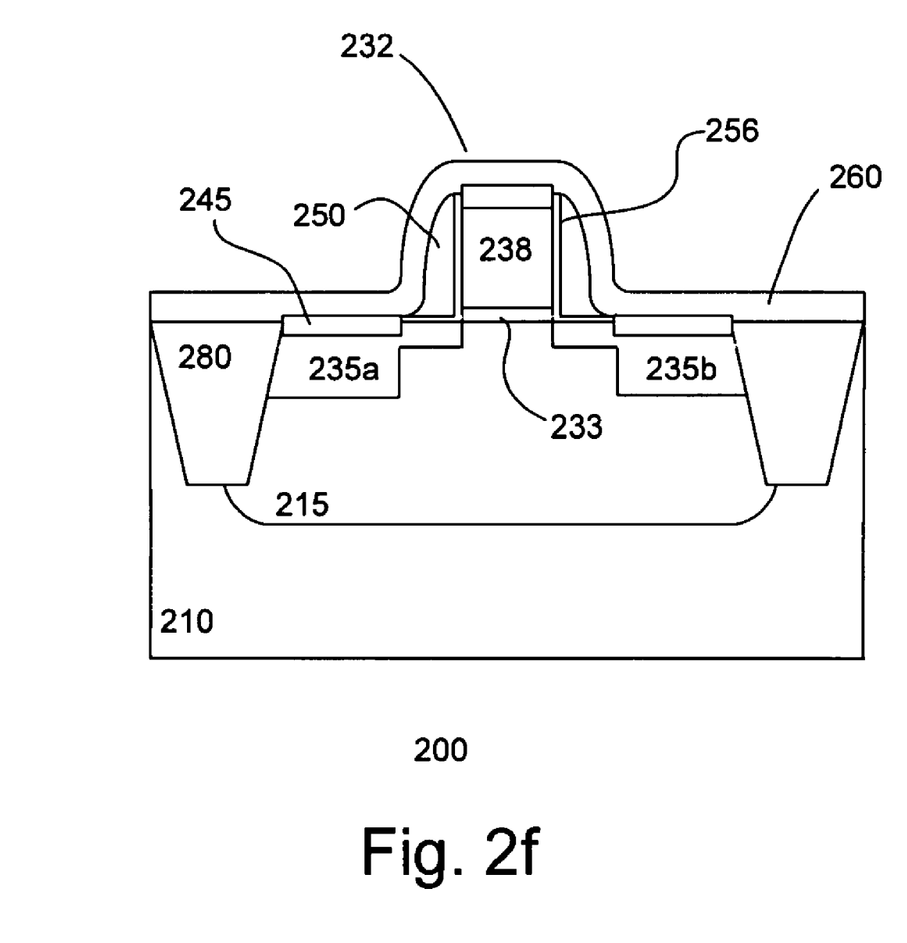

As shown in FIG. 2f, metal silicide contacts 245 can be formed on the gate electrode and diffusion regions. The metal silicide contacts, for example, comprise nickel silicide contacts. Other types of metal silicide contacts are also useful. To form the metal silicide contacts, a metal layer is formed on the substrate and annealed to cause a reaction with the silicon substrate. Unreacted metal is removed, leaving the silicide contacts.

In one embodiment, a contact etch stop layer 260 is formed on the substrate, covering the transistor. The etch stop layer, for example, comprises a dielectric material such as silicon nitride. Other types of dielectric materials are also useful. In one embodiment, the etch stop layer may comprise a first stress for enhancing carrier mobility in the channel of the transistor. For example, a compressive etch stop layer is formed over a p-type transistor while a tensile etch stop layer is formed over a n-type transistor. Other configurations of etch stop layers are also useful.

Figure 2G:
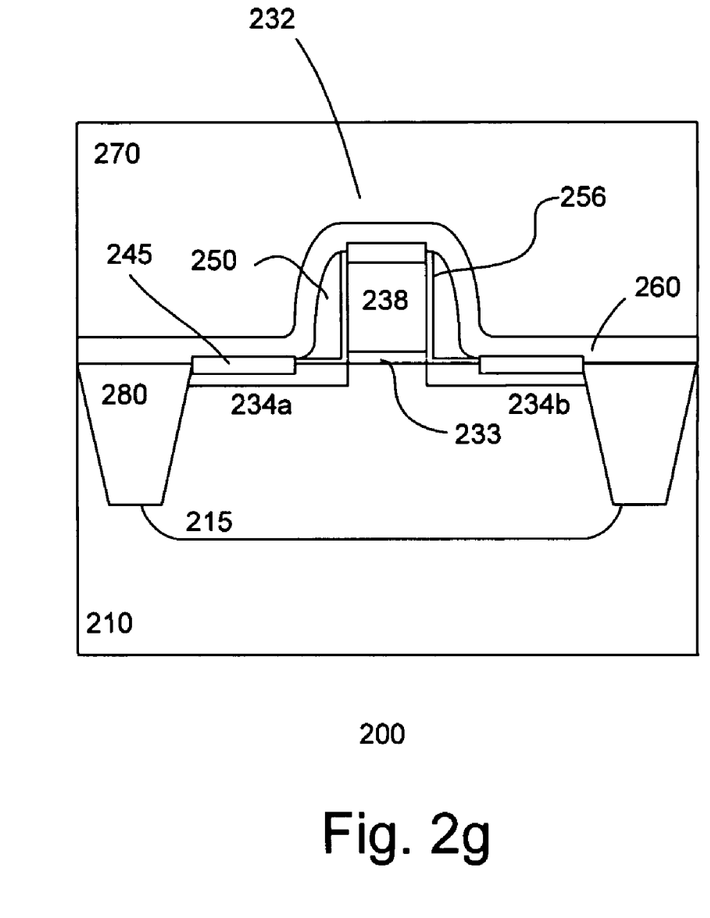

As shown in FIG. 2g, a dielectric layer 270 is deposited over the substrate, covering the transistor. The dielectric layer, for example, comprises a low-k (LK) or ultra low-k (ULK) dielectric material. Various types of LK or ULK materials, such as organo-silicate glass (OSG) and fluorine-doped silicate glass (FSG), can be employed. Other types of dielectric materials are also useful. For example, the dielectric layer can comprise silicon oxide, doped silicon oxide such as fluorinated silicon oxide (FSG), undoped or doped silicate glasses such as boron phosphate silicate glass (BPSG) and phosphate silicate glass (PSG), undoped or doped thermally grown silicon oxide, undoped or doped TEOS deposited silicon oxide.

The dielectric layer serves as an ICD layer in which interconnects are formed. The dielectric layer may be a single dielectric layer or multiple layers, depending on interconnect integration scheme employed. The dielectric layer or layers can be deposited using various types of deposition techniques. For example, chemical vapor deposition (CVD) processes such as plasma enhanced (PECVD), high density (HD-CVD), atmospheric pressure (APCVD), or a combination thereof can be used. Other techniques such as spin-on processes are also useful. The specific process, for example, can depend on the type of material used and application. By providing tunable spacers, gap fill of the dielectric layer is improved.

The process continues to complete fabricating the IC. For example, the process continues to form interconnects and additional interconnect levels, passivation layer, dicing, assembly and packaging.

Figure 3:
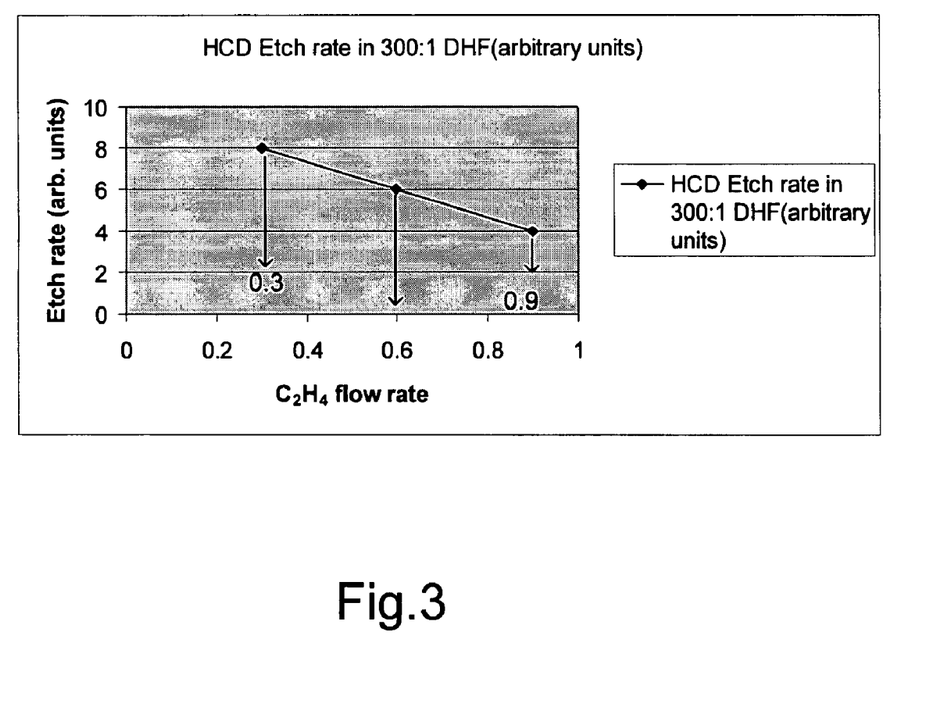
FIG. 3 shows etch rate of a tunable spacer layer vs. flow rate of ERC dopant source using a wet etch chemistry.

FIG. 3 shows a plot 300 of etch rates in 300:1 DHF versus $C_2H_4$ flow used to form carbon doped HCD dielectric layer. The flow of $C_2H_4$ corresponds to dopant concentration of the carbon doped HCD layer. The graded dopant profile can be tailored to achieved the desired differential etch rates in the spacer layer to produce the desired spacer sidewall profile.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate with an active region, the substrate is prepared with a gate;
   forming sidewall spacers on sidewall of the gate, wherein a portion of the spacers is processed to produce an etch rate differential between the processed portion and an unprocessed portion of the spacers; and
   performing a tuning process on the spacers to produce a desired profile based on the etch rate differential of the processed and unprocessed portions of the spacers.

2. The method of claim 1 wherein forming the sidewall spacers comprises:
   depositing a spacer layer to cover the substrate and gate; and
   patterning the spacer layer to remove horizontal components, leaving sidewall spacers on the sidewall of the gate.

3. The method of claim 1 wherein forming sidewall spacers comprises doping the sidewall spacers with etch rate controlling (ERC) dopants.

4. The method of claim 1 wherein the tuning process includes an isotropic etch.

5. The method of claim 2 wherein the sidewall spacers comprise hexochlorosilane (HCD) silicon nitride.

6. The method of claim 2 wherein the spacer layer comprises an etch rate differential between the processed portion and unprocessed portion in the tuning process.

7. The method of claim 3 wherein the ERC dopants comprise carbon.

8. The method of claim 3, wherein the ERC dopants are configured to reduce the etch rate of the spacers.

9. The method of claim 6 wherein the etch rate differential comprises an etch rate in the unprocessed portion which is higher than an etch rate in the processed portion.

10. A method for forming a device comprising:
    providing a substrate with an active region, the substrate is prepared with a gate;
    forming sidewall spacers on sidewall of the gate, wherein a portion of the spacers is doped with etch rate controlling (ERC) dopants to produce an etch rate differential between the doped portion and an undoped portion of the spacers in a tuning process; and
    performing the tuning process on the spacers to produce a desired profile based on the etch rate differential of the doped and undoped portions of the spacers.

11. The method of claim 10 wherein:
    the ERC dopants comprise carbon; and
    the sidewall spacers comprise hexochlorosilane (HCD) silicon nitride.

12. A method for forming tunable sidewall spacers comprising:
    providing a substrate having a feature thereon;
    forming a dielectric layer on the substrate covering the feature;
    patterning the dielectric layer to form sidewall spacers;
    doping a portion of the sidewall spacers with etch rate controlling (ERC) dopants to produce an etch rate differential between the doped portion and an undoped portion in a tuning process; and processing the sidewall spacers to form spacers with a desired profile based on the etch rate differential of the doped and undoped portions of the spacers.

13. The method of claim 12 wherein the dielectric layer comprises hexochlorosilane (HCD) silicon nitride.

14. The method of claim 12 wherein the dielectric layer comprises an etch rate differential between the doped portion and undoped portion in the tuning process.

15. The method of claim 12 wherein processing the sidewall spacers includes an isotropic etch.

16. The method of claim 14 wherein the etch rate differential comprises an etch rate in the undoped portion which is higher than an etch rate in the doped portion.

17. A method for forming a device comprising:
providing a substrate with an active region, the substrate is prepared with a gate;
forming sidewall spacers on sidewall of the gate, wherein a portion of the spacers is doped with etch rate controlling (ERC) dopants to produce an etch rate differential between the doped portion and an undoped portion of the spacers in a tuning process;
performing the tuning process on the spacers to produce a profile wherein a width of the spacers in the undoped portion is reduced at a greater rate than the doped portion; and
wherein the sidewall spacers comprise:
an initial width ratio before performing the tuning process on the spacers;
a final width ratio after performing the tuning process on the spacers, wherein the initial width ratio is greater than the final width ratio; and
wherein the width ratio is equaled to the width of the undoped portion of the spacers divided by the width of the doped portion of the spacers.

18. The method of claim 17, wherein the initial width ratio is greater than the final width ratio by about 0.1 to about 0.9.

19. A method for forming a device comprising:
providing a substrate with an active region, the substrate is prepared with a gate;
forming sidewall spacers on sidewall of the gate;
doping a portion of the sidewall spacers with etch rate controlling (ERC) dopants to produce an etch rate differential between the doped portion and an undoped portion of the spacers in a tuning process; and
performing the tuning process on the spacers to produce a profile wherein a width of the spacers in the undoped portion is reduced at a greater rate than the doped portion;
wherein the performing the tuning process comprises reducing the undoped portion about 50% faster than the doped portion.

20. The method of claim 19, wherein the doping a portion of the sidewall spacers comprises doping in-situ.

21. A method of forming a device which comprises:
forming a gate on a substrate;
forming a dielectric on the gate;
forming a spacer on the sidewall of the gate;
doping the spacer with dopants, wherein the dopants are configured to reduce the etch rate of the spacer; and
after forming the spacer, etching the spacer to produce a spacer profile in which a slope at an upper portion of the spacer is steeper than at a lower portion of the spacer, wherein the upper portion of the spacer is etched at a greater rate than the lower portion of the spacer.

22. The method of claim 21 wherein the etching the spacer includes an isotropic etch.

23. A method of forming a device which comprises:
forming a gate on a substrate;
forming a dielectric on the gate;
forming a spacer on the sidewall of the gate;
doping the spacer with dopants, wherein the dopants are configured to reduce the etch rate of the spacer; and
after forming the spacer, etching the spacer, wherein an upper portion of the spacer is etched at a greater rate than a lower portion of the spacer;
wherein the spacer comprises:
an initial width ratio before etching the spacer;
a final width ratio after etching the spacer, wherein the initial width ratio is greater than the final width ratio; and
wherein the width ratio is equal to, the width of the upper portion of the spacer divided by the width of the lower portion of the spacer.

* * * * *